(12) United States Patent
Wang et al.

(10) Patent No.: US 6,911,927 B2
(45) Date of Patent: Jun. 28, 2005

(54) OVER-SAMPLING DIGITAL-TO-ANALOG CONVERTER WITH VARIABLE SAMPLING FREQUENCIES

(75) Inventors: Wen-Chi Wang, YunLin (TW); Shih-Yu Ku, Hsinchu (TW); Jui-Cheng Huang, Hsinchu (TW); Yi-Shu Chang, TaiNan (TW)

(73) Assignee: Realtek Semiconductor Corp. (TW)

( * ) Notice: Subject to any disclaimer, the term of this patent is extended or adjusted under 35 U.S.C. 154(b) by 0 days.

(21) Appl. No.: 10/310,323

(22) Filed: Dec. 5, 2002

(65) Prior Publication Data

US 2003/0107507 A1 Jun. 12, 2003

(30) Foreign Application Priority Data

Dec. 6, 2001 (TW) ........................................ 90130286 A

(51) Int. Cl.[7] .................................................. H03M 3/00
(52) U.S. Cl. ...................................... 341/143; 341/144
(58) Field of Search ................................ 341/143, 144, 341/61, 155

(56) References Cited

U.S. PATENT DOCUMENTS

| 5,313,205 A | * | 5/1994 | Wilson ........................ 341/144 |
| 5,497,152 A | | 3/1996 | Wilson et al. ................. 341/61 |
| 5,598,432 A | * | 1/1997 | Wei ............................ 375/229 |
| 5,748,126 A | * | 5/1998 | Ma et al. ..................... 341/143 |
| 5,982,305 A | | 11/1999 | Taylor ......................... 341/61 |
| 6,084,916 A | * | 7/2000 | Ott ............................. 375/259 |
| 6,177,896 B1 | * | 1/2001 | Min ............................ 341/143 |
| 6,255,975 B1 | * | 7/2001 | Swanson ..................... 341/143 |
| 6,392,576 B1 | * | 5/2002 | Wilson et al. ............... 341/143 |
| 6,462,690 B1 | * | 10/2002 | Gaboriau et al. ........... 341/144 |
| 6,531,973 B2 | * | 3/2003 | Brooks et al. .............. 341/143 |

* cited by examiner

Primary Examiner—Peguy JeanPierre

(57) ABSTRACT

The present invention offers an over-sampling digital-to-analog converter with variable sampling frequencies to process input signals of variable sampling frequencies. The over-sampling digital-to-analog converter comprises an expander, which expands said input signals with a fixed rate of M to produce over-sampling signals; a digital low-pass filter, which filters out high-frequency ingredients of over-sampling signals and then outputs data with a first rate; a data buffer, which receives the outputted data by said digital low-pass filter with the first rate and outputs the data with a second rate; a modulator, which reads data in said data buffer with the second rate and modulates the data; a digital-to-analog converter, which converts the modulated data to analog signals; and an analog low-pass filter, which filters out high-frequency ingredients of said analog signals for producing output signals. No matter how the sampling frequency of the input signals is, due to reading rates of the modulator are the same, the over-sampling digital-to-analog converter ensures that noise is mostly distributed in the high-frequency band.

20 Claims, 3 Drawing Sheets

OVER-SAMPLING DIGITAL-TO-ANALOG CONVERTER WITH VARIABLE SAMPLING FREQUENCIES

BACKGROUND OF THE INVENTION

1. Field of the Invention

The present invention is related to an over-sampling digital-to-analog converter with variable sampling frequencies. Especially, it is related to the over-sampling digital-to-analog converter with variable sampling frequencies that has data buffering circuits between digital low-pass filter and modulator.

2. Description of the Prior Art

FIG. 1 is a block diagram of the over-sampling digital-to-analog converter. After input signals passing through an expander 11 and a digital low-pass filter 12, over-sampling digital signals are generated. A modulator 13 sigma-delta modulates the over-sampling digital signals and outputs the modulated signals with less number of bits, such as one-bit digital signal. The modulated digital signals are then sent to a digital-to-analog converter 14 and converted to analog signals. A low-pass filter 15 filters out the high-frequency noise introduced from modulator 13 to produce analog output signals. Taking audio signals as an example, a sampling frequency of input signals is 48 KHz ($f_s$=48 KHz), a 64-time over-sampling rate is adopted for producing digital signals with over-sampling frequency of 3.072 MHz (64$f_s$= 3.072 MHz). After that, the delta-sigma modulator 13 generates modulated digital signals with single bit. The modulated digital signals contain input signals that are band-limited in 20 KHz and high-frequency noise introduced from the delta-sigma modulator 13. The noise is mostly distributed in a band above 20 KHz. The modulated signals are then converted to analog signals via a digital-to-analog converter, and filtered out noise above 20 KHz by low-pass filter 15, to produce analog audio signals. The rate of the system clock (MCLK) can be 3.072 MHz (64 $f_s$=3.072 MHz).

If the sampling frequency of the input signals is not fixed, for example, the sampling frequency of the input signals may be 48 KHz, 44.1 KHz, 36 KHz, 24 KHz, 22.05 KHz, 16 KHz, 12 KHz, 11.025 KHz, or 8 KHz, the most direct way is to change the rate of the system clock (MCLK). For instance, when the sampling frequency $f_s$ of the system input signals is 48 KHz, the clock rate of MCLK is 3.072 MHz; when the sampling frequency $f_s$ of the system input signals changes to a quarter of the original, which is 12 KHz, the rate of the system clock (MCLK) is also changed to a quarter of the original, and the value is 768 KHz. The merit of this method is that the same system can be re-used under different input signals with various sampling frequencies, all we have to do is modifying clock rate of the system. The shortcoming is that, when the operating frequencies of the delta-sigma modulator are lowered, the in-band noise will be larger. Taking audio signals as an example, the noise in the band below 20 KHz can be heard. When the sampling frequency of input signals is 48 KHz ($f_s$=48 KHz) and the sigma-delta modulator is operated at 64fs, the delta-sigma modulator will mainly produce the noise above 20 KHz. As showing in FIG. 2(a), a curve L1 is the distribution of noise of the delta-sigma modulator; a curve L2 is the distribution of frequency of input signals. Further, when $f_s$ is equal to 16 KHz and the clock frequency is one third of the original, the main noise is distributed above 6.6 KHz (20/3 KHz=6.6 KHz). Normally the noise between 6.6 to 20 KHz can be heard by human being, like shown in FIG. 2(b), whose curve L3 is the distribution of noise of the delta-sigma modulator, and a curve L4 is the distribution of frequency of input signals.

There are three methods in prior arts to improve the shortcoming of louder noise in the condition of lower sampling frequency $f_s$.

The first method is to rise up the over-sampling frequency. For instance, to raise over-sampling frequency up to 384 $f_s$, the over-sampling frequency is still 3.072 MHz when fs is 8 KHz, and the amount of the noise introduced by the sigma-delta modulator within 20 KHz is still the same. Unfortunately the over-sampling frequency is too high when fs=48 KHz, and it directly increases the difficulty in designing such circuits.

The second method is to adopt sigma-delta modulator with higher order. The modulator with higher order is capable to lower down noise in low frequency band, moving the noise to higher frequency band. For example, if a modulator with higher order produces the noise mostly in the band above 120 KHz when the sampling frequency of input signals is 48 KHz, when the system clock operates at ⅙ of the original rate, which means the sampling frequency of input signals becomes 8 KHz, the noise introduced from the modulator will be still in the band above 20 KHz. Thus, even if the sampling frequency $f_s$ is lower, the noise is yet in an acceptable range. The shortcoming is that the complexity is higher to implement a modulator with higher order, resulting in a product with larger area and more power consumption.

The third method is to use control circuits, such as a central processor, so that we can set different over-sampling rate depending on variable sampling frequencies. The method is described in U.S. Pat. No. 5,313,205. When the sampling frequency is lower, the over-sampling rate will generally be higher, thus the modulator always operates beyond a certain rate. To derive from the aforesaid, the noise within 20 KHz will not be over loud by the lower operating frequency of the modulator. This method needs additional control circuits such as a central processor and results in additional costs.

SUMMARY OF THE INVENTION

The main objective of the present is to offer an over-sampling digital-to-analog converter with variable sampling frequencies, which does not need additional control circuit.

The other objective of the present invention is to offer an over-sampling digital-to-analog converter with variable sampling frequencies, whose modulator always works at a fixed operating frequency.

The third objective of the present invention is to offer an over-sampling digital-to-analog converter with variable sampling frequencies, whose operating frequency and the expanding rate of the expander are always fixed.

To approach above objectives, the present invention comprises an expander, a digital low-pass filter, a data buffer, a modulator, a digital-to-analog converter and an analog low-pass filter. The expander expands input signals to produce over-sampling signals based on a fixed rate M. The digital low-pass filter filters out high-frequency ingredients and writes input signals into the data buffer. The modulator reads the data in data buffer in first-in-first-out way and generates digital signals with less number of bits after modulation. The digital-to-analog converter converts the modulated output signals to analog signals. The analog low-pass filter filters out high-frequency ingredients of analog signals to result output signals.

The data buffer transfers the data with asynchronous operating clock. Based on the fixed rate of the operating clock at the modulator stage, the noise introduced by the modulator will mostly be in the high frequency band, independent of the sampling frequency of the input signals.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

DETAILED DESCRIPTION OF THE INVENTION

The following drawing describes the over-sampling digital-to-analog converter with variable sampling frequencies of the present invention.

Figure 1:
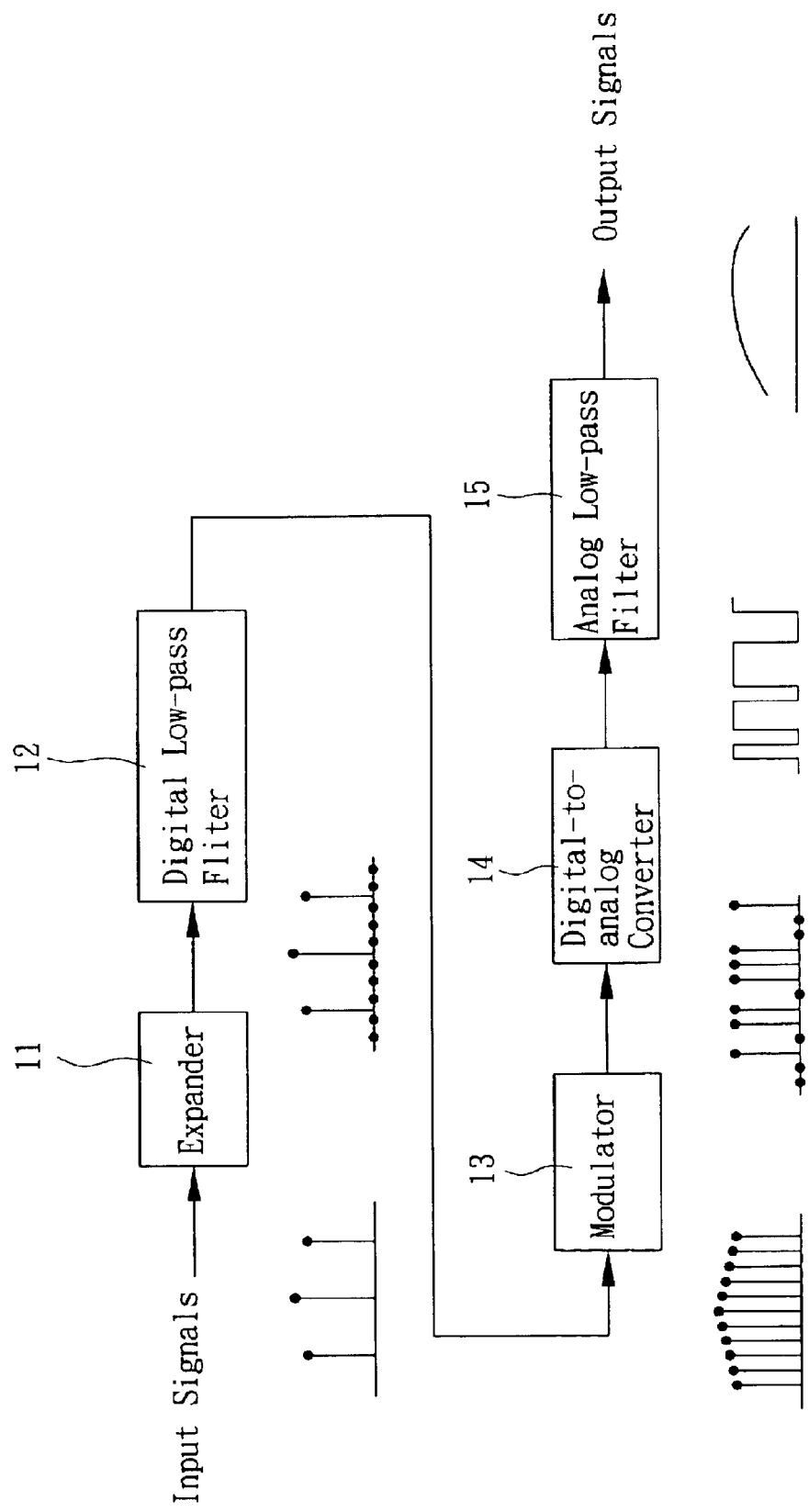
FIG. 1 is a structure of an over-sampling digital-to-analog converter in prior art.
Figure 2:
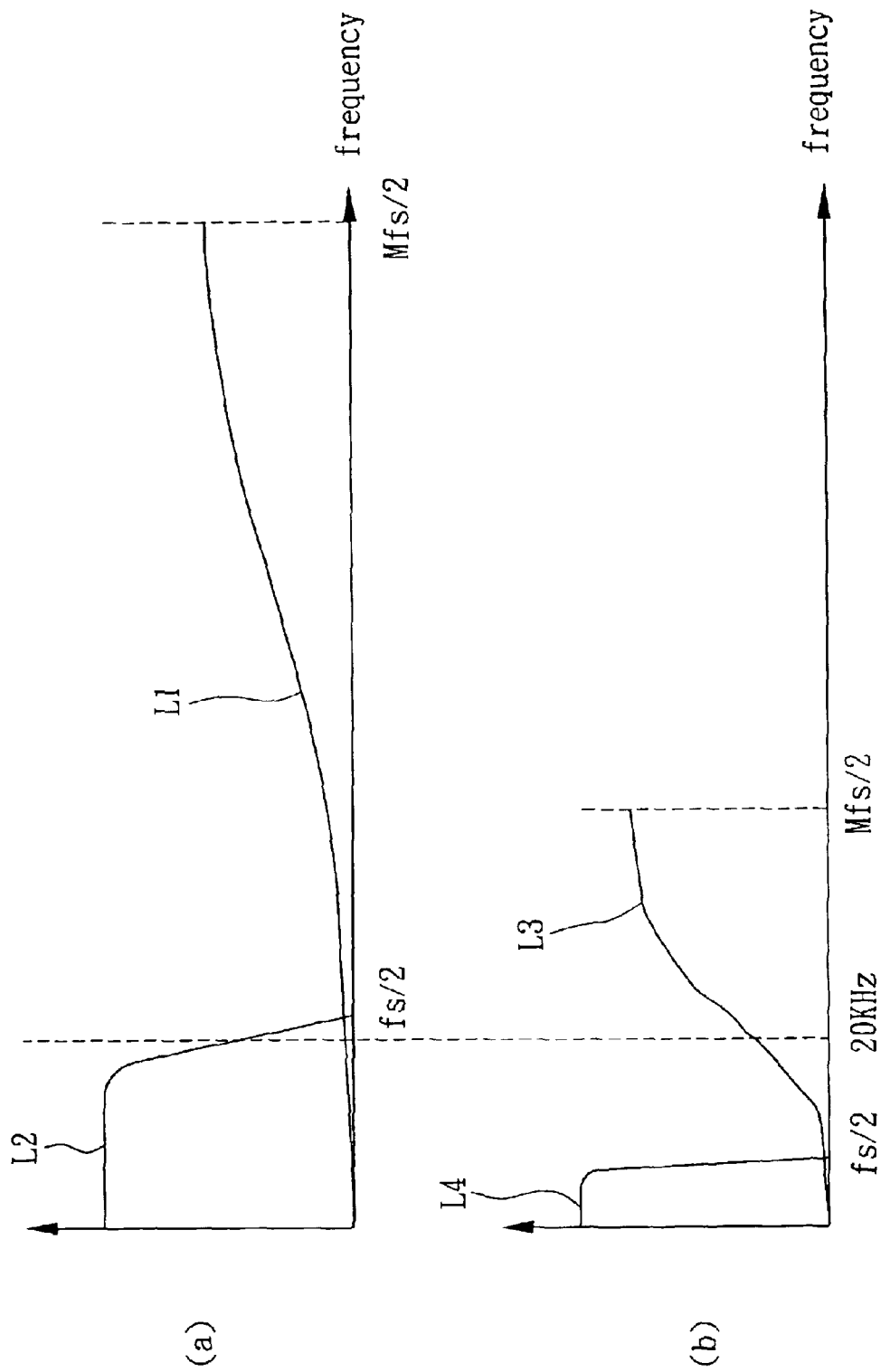
FIG. 2 is the signals when an over-sampling digital-to-analog converter is in different sampling frequencies, wherein the sampling frequency of FIG. 2(a) is 48 KHz; 2(b) is 16 KHz.
Figure 3:
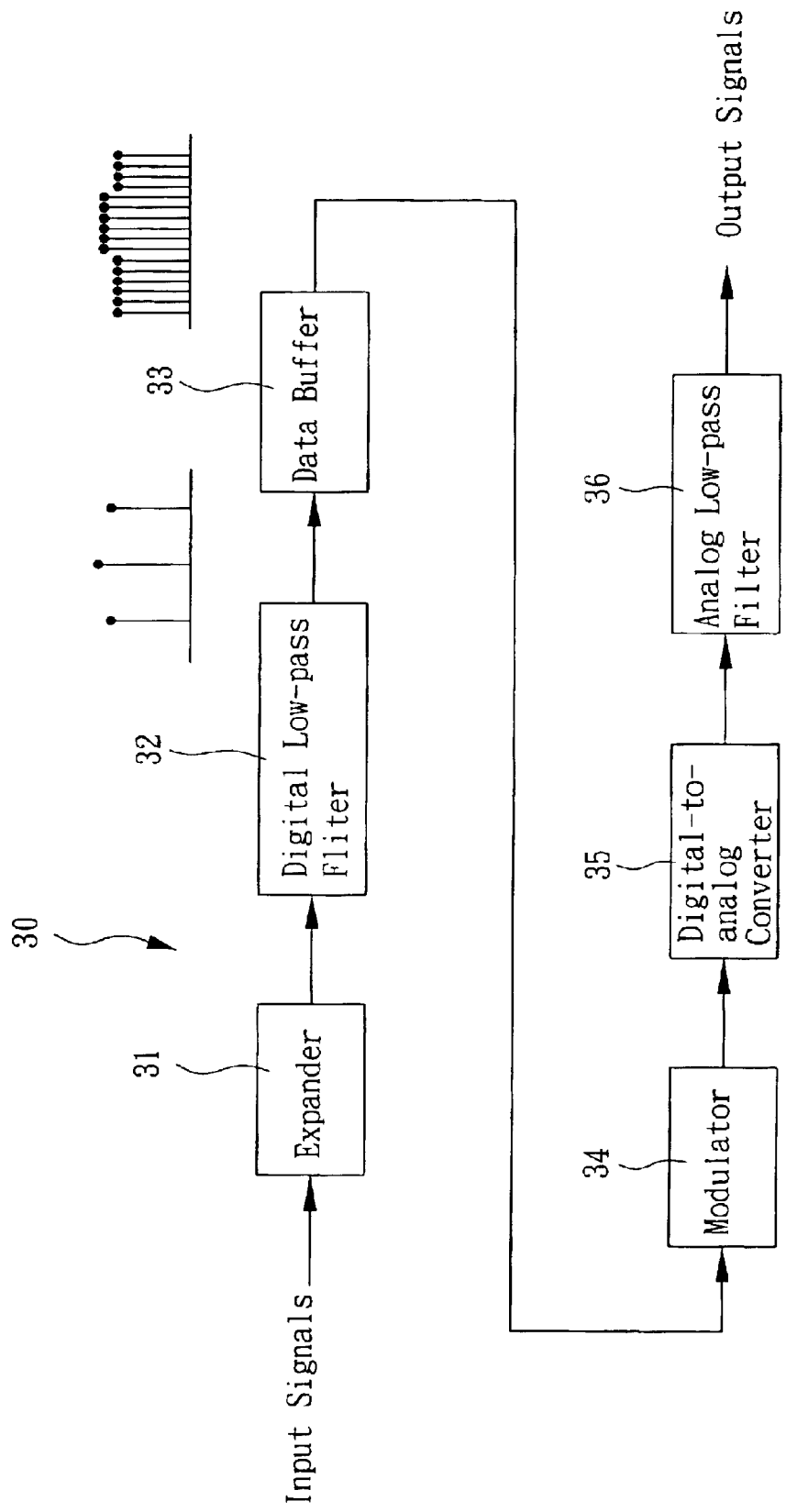
FIG. 3 is a structure of an over-sampling digital-to-analog converter of the present invention.

FIG. 3 is a structure of an over-sampling digital-to-analog converter of the present invention. The over-sampling digital-to-analog converter 30 comprises an expander 31, a digital low-pass filter 32, a data buffer 33, a delta-sigma modulator 34, a digital-to-analog converter 35 and an analog low-pass filter 36.

The expander 31 receives digital input signals whose sampling frequency is $f_s$, such as digital audio signals, then raise the frequency up to M times of its original. Namely the expander 31 inserts M−1 zeros between each samples. The frequency of the over-sampling signals is fs×M, M must be a fixed integer independent of the sampling frequency of the input signals. Taking M=64 as an example, if the sampling frequency $f_s$ of the input signals is 48 KHz, the sampling frequency of the over-sampling signals is 3.072 MHz. Again, if the sampling frequency $f_s$ of the input signals is 8 KHz, the sampling frequency of the over-sampling signals is 512 KHz. Due to the structure and functions of the expander 31 are same with prior arts, it is not described any further hereinafter.

The over-sampling signals produced by the expander 31 are inserted zeros between samples, thus the unnecessary high-frequency ingredients are introduced. The digital low-pass filter 32 receives the over-sampling signals and filters out the high-frequency ingredients and generates the first filtered signals. The technologies for the digital low-pass filter 32 are the same as prior arts, and they will not be described any further hereinafter.

Since the sampling frequency $f_s$ of the input signals is variable, the frequency of the over-sampling signals from the expander 31 and the data output rate of the digital low-pass filter 32 are changeable correspondingly. If setting expanding rate is 64 and the sampling frequency $f_s$ of the input signals is 48 KHz, the sampling frequency of the over-sampling signals and the data output rate of the digital low-pass filter 32 may then both be 3.072 MHz. If the sampling frequency fs is one fourth of the original ($f_s$=12 KHz), the sampling frequency of the over-sampling signals and the data output rate of the digital low-pass filter 32 may then both be 768 KHz, which is a quarter of the original as well.

The over-sampling digital-to-analog converter 30 uses the data buffer 33 to finish data transfer of asynchronous operating clock. Digital low-pass filter 32 writes digital data into data buffer 33 at a first rate, and the delta-sigma modulator 34 reads data from data buffer 33 at a second rate. In the embodiment, data buffer 33 is a FIFO (First In First Out) buffer, which may be implemented by multiple D flip-flops, register files or dual-port RAM. Output rate of digital low-pass filter 32 of the embodiment may not be higher than reading rate of delta-sigma modulator 34, namely the first rate is not higher than the second rate. Therefore, when data buffer 33 is empty and delta-sigma modulator 34 asking for next data, data buffer 33 sends the last data continuously.

If the expanding rate is 64 and sampling frequency $f_s$ of input frequency is 44.1 KHz, the frequency of the over-sampling signals is 2.8224 MHz, and digital low-pass filter 32 outputs data to data buffer 33 by the first rate. If the data input rate (the second rate) of the delta-sigma modulator 34 being fixed as 3.072 MHz, delta-sigma modulator 34 will read data from data buffer 33 by the rate of 3.072 MHz; that is to reach the object of data transfer of asynchronous operating clock. Due to the rate of writing data is lower than the rate of reading data, data buffer 33 is continuously sending the last data while delta-sigma modulator 34 asking of reading data and data buffer 33 being empty.

The sampling frequency of input data is changed, and the first rate is then adjusted as well, but the reading rate (the second rate) of delta-sigma modulator 34 from data buffer 33 is still kept a fixed value. For instance, while sampling frequency $f_s$ of input data accepts 32 KHz and data output rate of digital low-pass filter 32 is altered to 2.048 MHz, delta-sigma modulator 34 still reads data from data buffer 33 with 3.072 MHz of the rate. As it can be seen, delta-sigma modulator 34 reads the data in data buffer 33 with a certain rate, independent of the sampling frequency of the input signals. If we set a suitable rate of delta-sigma modulator 34, noise produced by delta-sigma modulator 34 will mostly be in the high frequency range. For instance, the reading and operating rate of delta-sigma modulator 34 is set as 3.072 MHz, and a second-order delta-sigma modulator fits the condition, which means the noise produced by the modulator is mostly above 20 KHz.

Delta-sigma modulator 34, digital-to-analog converter 35 and digital low-pass filter 36 of over-sampling digital-to-analog converter 30 of the present invention are the same as the ones in prior art; hence they are not discussed hereinafter.

The following is the method for the conversion of over-sampling digital-to-analog of the present invention, which is:

1. expansion: to expand input signals via a fixed rate of M to produce over-sampling signals. The fixed rate M is not changed with change of sampling frequency $f_s$ of the input signals;
2. digital filtering: to filter out high-frequency ingredients of over-sampling signals via digital circuits and output data to a data buffer via a first rate. The first rate is proportional to the sampling frequency $f_s$ of the input signals, such as that the sampling frequency $f_s$ multiplied by the fixed rate M is the first rate;

3. data modulation: to read data from data buffer via a second rate and then modulate data to become data with less number of bits, such as data with single bit. Wherein the second rate is a fixed value and not changeable with the sampling frequency $f_s$. A suitable value can be chosen for the second rate to avoid including the noise of 20 KHz after modulating band, such as the rate of 3.072 MHz;

4. conversion from digital to analog: to convert modulated data to analog signal. Due to the fact that the number of bits is less, the conversion between digital and analog is easier;

5. analog filtering: to filter out high frequency ingredients of analog signals to produce output signals.

The present invention uses the data buffer to connect digital-to-analog converter and delta-sigma modulator, thus the operating frequency of the delta-sigma modulator can be set as a fixed value so that the noise produced by delta-sigma modulator may keep above a certain frequency. An expander can expand the digital signals at a fixed expanding rate, thus additional control circuit is no longer needed to set variable expanding rates Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An over-sampling digital-to-analog converter system comprising:

an interpolator receiving an input signal having an input sampling frequency and interpolating said input signal to produce an interpolated signal;

a data buffer receiving said interpolated signal from said interpolator with a first rate and outputting said interpolated signal;

a modulator modulating said interpolated signal from said data buffer to produce a digital modulated data using the operation frequency, wherein said operation frequency is independent of said input sampling frequency;

a digital-to-analog converter (DAC), coupled to said modulator, converting said digital modulated data to an analog signal; and a first low-pass filter, coupled to said DAC, receiving said analog signal and reducing a high frequency noise.

2. The system of claim 1, wherein said data buffer outputs said interpolated signal according to said operation frequency.

3. The system of claim 2, wherein said interpolator comprising:

an expander oversampling said input signal and providing an output; and a second low-pass filter, coupled to said expander, receiving said output of said expander and filtering that output.

4. The system of claim 1, wherein quantization noise is moved substantially outside of a passband of said input signal.

5. The system of claim 1, wherein said input sampling frequency of said input signal multiplied by an interpolation ratio of the interpolator is equal to said first rate.

6. The system of claim 1, wherein said modulator is a delta-sigma modulator.

7. The system of claim 1, wherein said data buffer asynchronously transfers said interpolated data from the interpolator to the modulator.

8. The system of claim 1, wherein said data buffer is constructed by a plurality of flip-flops or register files or a dual-port RAM or a FIFO.

9. The system of claim 1, wherein said data buffer outputs a last data when said data buffer is empty.

10. A method for over-sampling digital-to-analog conversion with variable sampling frequencies comprising:

interpolating an input signal having an input sampling frequency to produce an interpolated signal;

outputting said interpolated signal according to an operation frequency;

modulating said interpolated signal to produce a modulated signal using the operation frequency, wherein the operation frequency is independent of the input sampling frequency;

converting said modulated data to an analog signal; and reducing a high frequency noise of said analog signal to produce an output signal.

11. The method of claim 10, wherein said operation frequency is fixed.

12. The method of claim 10, wherein said step of modulating is a step of delta-sigma modulating.

13. The method of claim 10, wherein further comprising:

storing said interpolated signal to a data buffer.

14. The system of claim 13, wherein said data buffer outputs a last data when said data buffer is empty.

15. A method for fixing the interpolation ratio of an interpolator within an digital-to-analog converter (DAC) system, the DAC system comprising a modulator having a operation frequency, the method comprising the steps of:

interpolating an input signal having an input sampling frequency to produce an interpolated signal; and storing said interpolated signal to a data buffer using a first rate;

outputting said interpolated signal from said data buffer according to the operation frequency of said modulator, wherein said operation frequency is independent of the input sampling frequency.

16. The method of claim 15, wherein said first rate is corresponding to said input sampling frequency.

17. An interpolating apparatus for an over-sampling digital-to-analog converter (DAC) system, the DAC system comprising a modulator having a operation frequency and being coupled to said interpolating apparatus, the interpolating apparatus comprising:

an interpolator for receiving an input signal having an input sampling frequency and interpolating said input signal to produce an interpolated signal; and a data buffer, coupled to said interpolator, receiving said interpolated signal with a first rate and outputting said interpolated signal according to the operation frequency of the modulator, wherein said operation frequency is independent of the input sampling frequency.

18. The interpolating apparatus of claim 17, wherein said operation frequency is independent of said first rate.

19. The interpolating apparatus of claim 17, wherein said data buffer asynchronously transfers said interpolated data from said interpolator to said modulator.

20. The interpolating apparatus of claim 17, wherein said data buffer outputs a last data when said data buffer is empty.

* * * * *